(12) United States Patent
Sinha

(10) Patent No.: US 6,872,659 B2
(45) Date of Patent: Mar. 29, 2005

(54) ACTIVATION OF OXIDES FOR ELECTROLESS PLATING

(75) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 10/223,315

(22) Filed: Aug. 19, 2002

(65) Prior Publication Data

US 2004/0033687 A1 Feb. 19, 2004

(51) Int. Cl.⁷ .............................................. H01L 21/44
(52) U.S. Cl. ........................ 438/678; 438/677; 438/680; 438/686; 438/754
(58) Field of Search ......................... 204/232; 438/618, 438/633, 656, 677, 678, 680, 686, 745, 754, 785; 427/601; 205/80, 104, 322

(56) References Cited

U.S. PATENT DOCUMENTS

| | | | | |
|---|---|---|---|---|
| 4,234,628 A | * | 11/1980 | DuRose | ...................... 427/305 |
| 5,169,680 A | * | 12/1992 | Ting et al. | ................... 438/629 |
| 5,824,599 A | * | 10/1998 | Schacham-Diamand et al. | . 438/678 |
| 5,891,513 A | | 4/1999 | Dubin et al. | |
| 6,054,172 A | | 4/2000 | Robinson et al. | |
| 6,054,173 A | * | 4/2000 | Robinson et al. | .......... 427/97.2 |
| 6,126,989 A | | 10/2000 | Robinson et al. | |
| 6,165,912 A | | 12/2000 | McConnell et al. | |
| 6,180,523 B1 | | 1/2001 | Lee et al. | |
| 6,326,303 B1 | | 12/2001 | Robinson et al. | |
| 6,396,148 B1 | | 5/2002 | Eichelberger et al. | |
| 6,436,816 B1 | * | 8/2002 | Lee et al. | .................... 438/643 |
| 6,528,409 B1 | * | 3/2003 | Lopatin et al. | ............. 438/618 |
| 6,686,237 B1 | * | 2/2004 | Wofford et al. | ............. 438/239 |
| 6,723,679 B2 | * | 4/2004 | Izaki et al. | .................. 502/330 |

OTHER PUBLICATIONS

Wei et al. "The Use of Selective Electroless Metal Deposition for Micron Size contact Fill", IEEE, 1988, p. 446–449.*
Tetsuya Osaka, Nao Takano, Tetsuya Kurokawa, Tomomi Kaneko, and Kazuyoshi Ueno; Electroless Nickel Ternary Alloy Deposition on SiO2 for Application to Diffusion Barrier Layer in Copper Interconnect Technology: Journal of The Electrochemical Society; 2002; C573–C578; The Electrochemical Society; Japan.

* cited by examiner

Primary Examiner—Asok Kumar Sarkar
(74) Attorney, Agent, or Firm—Dinsmore & Shohl LLP (57) ABSTRACT

The present invention provides approaches for electroless deposition of conductive materials onto the surface of oxide-based materials, including nonconductive metal oxides, in a manner that does not require intervening conductive pastes, nucleation layers, or additional seed or activation layers formed over the surface of the oxide-based layer. According to one embodiment of the present invention, a layer of a titanium-based material is formed over an oxide-based surface. The layer of titanium-based material is subsequently removed from the surface of the oxide-based layer in a manner such that the surface of the oxide-based layer is activated for electroless deposition. A metal or metal alloy is then plated over the oxide-based surface using electroless plating techniques.

40 Claims, 4 Drawing Sheets

ACTIVATION OF OXIDES FOR ELECTROLESS PLATING

BACKGROUND OF THE INVENTION

The present invention relates generally to electroless plating and in particular to the activation of oxide surfaces for electroless plating.

Electroless plating is a wet chemical plating technique utilized by the semiconductor industry to deposit thin films of metal or metal alloy over a substrate during the fabrication or packaging of semiconductor devices. Electroless plating can be accomplished with relatively low cost tooling and materials as compared to electroplating. Further, electroless plating is selective, provides excellent step coverage, and good filling capabilities, even when filling high aspect ratio trenches and vias. Accordingly, electroless plating is suitable for the construction of submicron feature devices.

Electroless plating is a controlled autocatalytic chemical reduction reaction of aqueous metal or metal alloy ions to a base substrate. That is, the metal or metal alloy being deposited serves to catalyze the reaction. Basically, a device such as a semiconductor structure is placed in an electroless plating bath. The electroless bath typically includes an aqueous solution of metal ions, complexing agents, and reducing agents. The bath may also include stabilizers, various additives, and buffers, as well as rate promoters to speed up or slow down the deposition process. As such, the particular composition of the plating bath typically varies based upon the specific application to account for the desired parameters of the plating process. Unlike conventional electroplating however, no electrical current or power supply, anodes, batteries, or rectifiers are required to perform an electroless plating deposition.

Electroless plating is of interest in the fabrication of semiconductor devices because electroless plating deposition provides a substantially uniform conductive layer that can conformally plate a substrate, even if the substrate has an irregular shape or deep openings. The rate of deposition of the metal layer may also be successfully controlled. The electroless plating process can be controlled to generally avoid plating material buildup up at the edges and corners of the substrate. As such, high aspect ratios, sharp edges, holes, trenches, and vias may all be successfully plated. Electroless deposition thus provides an attractive alternative processing technique when conventional processing such as using physical vapor deposition (PVD) cannot provide satisfactory step coverage. Also, electroless plating layers are virtually nonporous, which allows for improved corrosion resistance.

During electroless plating, the metal ions in the plating bath are reduced on a catalytic surface by a reducing agent. Accordingly, the portions of a substrate to be plated generally must be of the same material, or exhibit an affinity for the plating metal or metal alloy. This is advantageous from the perspective that plating may occur at the same time on electrically isolated areas of the device being plated. This also allows selectivity to the deposition process. However, certain nonconductive substrates such as oxides and nonconductive metal oxides are not catalytically active.

In order to utilize electroless plating techniques over an oxide surface according to a conventional approach, one or more nucleating layers or seed layers are deposited over the oxide layer. Optionally, one or more barrier layers may also be required, depending upon the materials involved. The seed layer may comprise for example, a conductive paste or a catalytic film applied by evaporation or sputtering. The seed layer is selected such that the seed layer adheres to the underlying oxide layer, yet exhibits a catalytic surface receptive to electroless plating.

BRIEF SUMMARY OF THE INVENTION

The present invention provides approaches for electroless deposition of conductive materials onto the surface of oxides, including nonconductive metal oxides, in a manner that does not require intervening conductive pastes, nucleation layers, or additional seed or activation layers formed over the surface of the oxide-based layer.

According to one embodiment of the present invention, a layer of a titanium-based material is formed over an oxide-based surface, for example, by chemical vapor deposition. The layer of titanium-based material is etched away in a manner such that the oxide-based surface is activated for electroless deposition. A metal or metal alloy is then plated over the oxide-based surface using electroless plating techniques.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

It shall be observed that the process steps and structures described herein do not form a complete process flow for manufacturing integrated circuits. The present invention can be practiced in conjunction with a variety of integrated circuit fabrication techniques currently used in the art. As such, commonly practiced process steps are included in the description herein only if those steps are necessary for an understanding of the present invention.

Further, as used herein, the formation of a layer or region "over" a substrate or other layer refers to formation above, or in contact with, a surface of the substrate or layer. For example, where it is noted or recited that a layer is formed over a substrate or other layer, it is contemplated that intervening structural layers may optionally be present between the layer and the substrate.

General Approach

Figure 1:
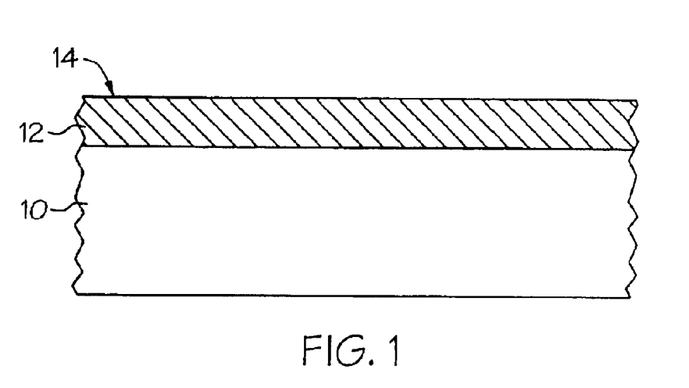
FIG. 1 is a cross-sectional illustration of a portion of a substrate material having an oxide-based layer deposited thereon.

With reference to FIG. 1, a semiconductor substrate 10 includes an oxide-based layer 12 formed thereon. The semiconductor substrate may include for example, a wafer, alone or in assemblies, a silicon substrate, silicon-on-insulator structure, silicon on ceramic structure, or any other layer of a semiconductor material such as gallium arsenide or indium phosphide. Further, the semiconductor substrate may be processed using any number of fabrication techniques to form trenches, wells, active areas, isolation regions, active devices and passive devices.

The oxide-based layer 12 includes a non-catalytic surface 14 upon which, it is desired to deposit a metal or metal alloy using electroless plating techniques. Depending upon the particular application and the device being fabricated, there may be any number of intervening layers of materials between the semiconductor substrate 10 and the oxide-based-layer 12. For the purposes of defining and describing the present invention, it is noted that the oxide-based layer 12 is a layer of any material that comprises an oxide alone or in combination with any material, composition, or mixture of materials. For example, the various embodiments of the present invention may be practiced on an oxide-based layer such as oxide (doped or undoped), silicon dioxide ($SiO_2$) (doped or undoped), phosphosilicate glass (PSG), borophosphosilicate glass (BPSG), silicon oxynitride, or any nonconductive metal oxide.

Figure 2:
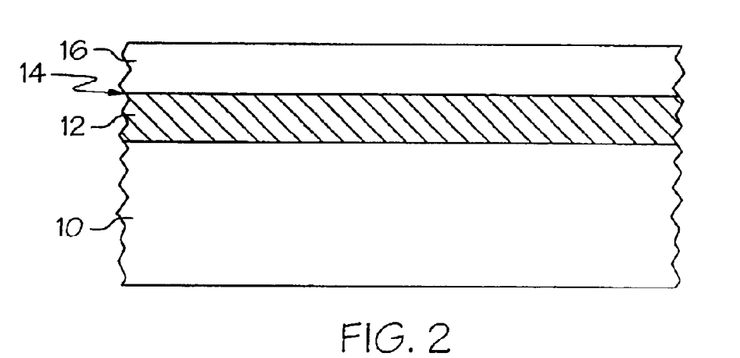
FIG. 2 is a cross-sectional illustration of the portion of the substrate shown in FIG. 1, wherein a titanium-based layer is formed over the oxide-based layer according to one embodiment of the present invention.

Referring to FIG. 2, a titanium-based layer 16 is formed over the oxide-based layer 12. The titanium-based layer 16 may comprise for example, a layer of titanium (Ti), a layer of titanium containing impurities therein, or a titanium alloy. The titanium-based layer 16 may be formed over the oxide-based layer 12 using any number of known processing techniques. For example, the titanium-based layer 16 may be deposited over the oxide-based layer 12 using chemical vapor deposition (CVD) techniques. The CVD process is preferably performed at a relatively high temperature, such as 550 degrees Celsius or higher. Alternatively, a PVD technique may be used to deposit the titanium-based layer 16. Subsequent to the PVD of the titanium-based layer 16, an anneal may be performed at any suitable temperature, such as a temperature of at least 550 degrees Celsius in an argon (Ar) ambience. Depending upon the specific application and the requirements of the device being fabricated, it may be preferable to selectively deposit the titanium-based layer 16 over the oxide-based layer 12. Such an approach allows for example, selective activation of the surface of the oxide-based layer 12.

Figure 3:
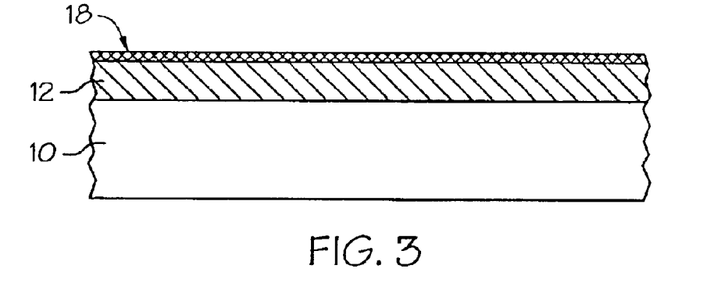
FIG. 3 is a cross-sectional illustration of the portion of the substrate shown in FIG. 2, wherein the titanium-based layer is etched from the surface of the oxide-based layer activating the surface (illustrated in the Figure by a cross-hatched area) for electroless deposition according to one embodiment of the present invention.

The titanium-based layer 16 is removed from the surface of the oxide-based layer 12, leaving a catalytic surface 18 that is activated for electroless plating as shown in FIG. 3. Both the non-catalytic surface 14 shown in FIG. 1, and the catalytic surface 18 shown in FIG. 3, represents the surface of the oxide-based material 12. However, the catalytic surface 18 shown in FIG. 3 is activated for electroless plating, and is generally capable of adhering to a subsequent electroless plating layer (not shown in FIG. 3). The cross-hatching shown in FIG. 3 generally about the catalytic surface 18 is not a separate layer. Rather, the cross-hatching is provided to distinguish the fact that the surface of the oxide-based layer 12 has been activated subsequent to the removal of the titanium-based layer.

Referring back to FIG. 2, numerous processing techniques can be used to remove the titanium-based layer 16 from the oxide layer 12. Etching of the titanium-based layer 16 is preferably conducted with an etch recipe that has an etch selectivity preferable to the titanium-based layer 16 over all other layers and materials formed over the substrate 10. That is, the etchant recipe preferably removes the exposed titanium-based layer 16 while leaving the remainder of the layers substantially un-etched.

For example, the titanium-based layer 16 may be removed from the oxide-based layer 12 by an etching process such as a wet chemical etching process in an Ammonium-hydroxide Peroxide Mixture (APM). Etching in APM allows control of the etch rate, for example, by modifying the etch recipe to change the medium concentration, etch temperature, or combinations thereof. Other etching processes such as a sulfuric acid etch with hydrogen peroxide, known in the industry as Piranha etch, may also be used. For example, a Piranha etch recipe may comprise a mixture of approximately 98% sulfuric acid ($H_2SO_4$) and 30% hydrogen peroxide ($H_2O_2$) in volume ratios 2–4:1 may be used, typically at temperatures in excess of 100 degrees Celcius. Ammonium persulfate ($NH_4)_2S_2O_8$ may be used in place of the hydrogen peroxide.

Figure 4:
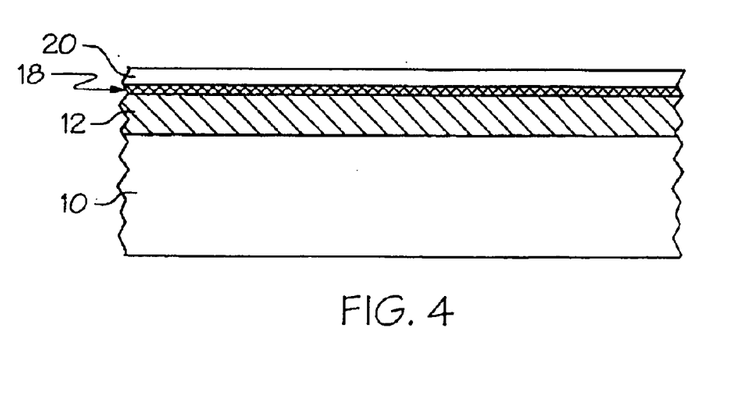
FIG. 4 is a cross-sectional illustration of the portion of the substrate shown in FIG. 3, wherein a conductive material is formed over the surface of the oxide-based layer using electroless plating techniques according to one embodiment of the present invention.

Referring to FIG. 4, a thin film or conductive layer 20 is formed over the catalytic surface using electroless plating techniques. The various embodiments of the present invention are suitable for example, using a Nickel-phosphorus (Ni—P) electroless plating. However, for the purposes of defining and describing the present invention, it is noted that the various embodiments of the present invention can be practiced with all electroless chemistries, using any metal or metal alloy. For example, nickel, gold, silver, copper, cobalt, palladium, platinum, rhodium, iron, tungsten, and alloys thereof, including ternary alloys such as nickel-phosphorous-copper or nickel-thallium-boron may be used interchangeably. The selection of a particular electroless chemistry will generally be application specific.

Also, while the electrolessly plated conductive layer 20 is illustrated as a thin film, the deposition process can control the actual thickness of the conductive layer 20. For example, depending upon the application, the amount of reducing agents in the electroless plating bath may be adjusted to achieve a desired pH as the application dictates. The final thickness of the electroless plated layer is generally dependent upon the pH of the electroless solution of the electroless plating bath. Generally, a higher pH results in a thicker plated layer. Further, chelating agents may be added to the electroless plating bath to prevent spontaneous metal precipitation, especially at higher pH levels. Further, organic and inorganic additives may be added to the bath to promote stability in the electroless process. Also, upon completion of the electroless plating deposition process, it may be necessary to perform subsequent processing and post plating treatment. For example, some electroless nickel layers may require heat treatment. Also, an optional activation pretreatment may be employed. For example, an activation pretreatment such as palladium, a tin-zinc combination, or any other activation pretreatment may be used.

An example of activating an oxide for electroless plating according to one embodiment of the present invention is as follows. A layer of Ti is deposited using CVD over a layer of BPSG. The layer of Ti is etched using APM or Piranha, and activation of the BPSG surface is achieved using a palladium chloride in hydrofluoric acid (HF/PdCl$_2$) chemistry. As one example, the layer of Ti is etched using APM at an elevated temperature, such as 35–60 degrees Celsius. Subsequently, an HF/PdCl$_2$ pretreatment solution is applied. Other aqueous solutions such as HCl, H$_2$SO$_4$, or acetic acid may be used in place of HF. Also, an adequate rinse, such as with DI water may be required after activation or cleaning. The solution concentrations may comprise for example, 0.3–6 milliliters of 49% HF per liter of activation chemistry and 0.01–0.5 grains of PdCl2 per liter of activation chemistry. A range of 3–5 milliliters per liter of HF and 0.1–0.2 grams per liter of PdCl2 applied for 10–60 seconds is suitable for the above application. Also, the pretreatment may be applied with or without a surfactant such as Triton X-100 in the order of 0 to 2 milliliters per liter.

Formation of a Capacitor Structure and a Via to a Substrate Contact

The present invention may be applied to electrolessly plate an oxide-based material. This extends to plating openings formed within the oxide-based material. For example, an opening may comprise a container, trench, via, region, or other structure. As one example, in the fabrication of metal-insulator-metal (MIM) capacitor structures, such as for dynamic random access memory (DRAM) applications, it is desirable to maintain a high storage capacitance. One manner to accomplish a high storage capacitance is to increase the height of the capacitor structure container. However, increasing the height of the capacitor container also increases the difficulty in forming the bottom plate electrode of the capacitor structure to be built. Even in structures that do not require relatively high capacitor containers, high aspect ratio vias, for example, 0.25 $\mu$m width to 1 $\mu$m height, may be desirable, especially when fabricating densely packed devices, or those devices requiring multiple levels of metallization.

According to one embodiment of the present invention discussed with reference to FIGS. 5–9, high aspect ratio structures including capacitor containers, trenches, via, and other openings can be plated by performing an electroless deposition directly to one or more oxide-based layers. The number, relative size, spacing of components, devices, and structures depicted in the Figures are exemplary only, and were selected for ease of explanation of the various aspects of the present invention. Accordingly, the representations of various structures may not be indicative of the number, relative size, or relative spacing of an operative embodiment of the present invention.

Figure 5:
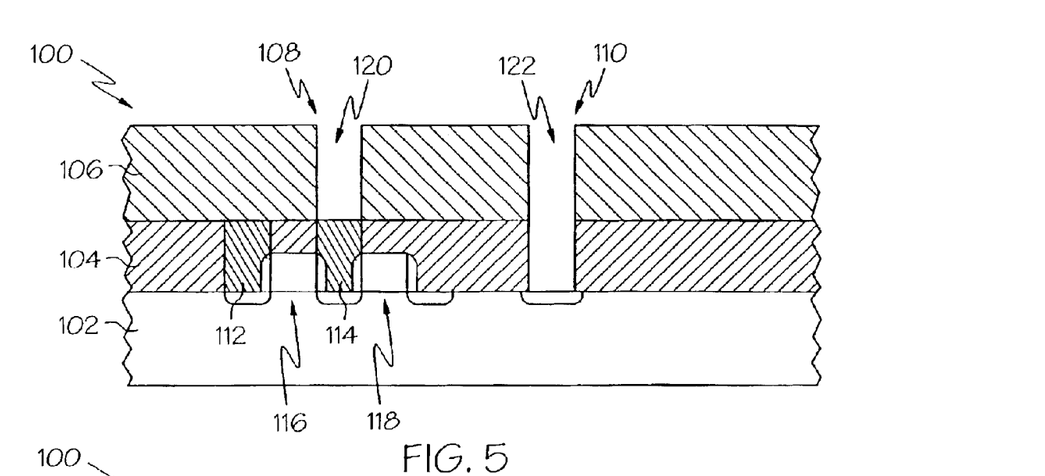
FIG. 5 is a cross-sectional illustration of a portion of a substrate material having two layers of oxide-based materials formed thereon, whereupon a capacitor structure is to be built over the substrate, and a contact is to be made to the substrate according to one embodiment of the present invention.

Referring to FIG. 5, a semiconductor device 100 comprises a semiconductor substrate 102, a first dielectric layer 104 formed over the semiconductor substrate 102, and a second dielectric layer 106 formed over the first dielectric layer 104. The semiconductor substrate 102 is processed as the specific device dictates. For example, it may be necessary to dope the semiconductor substrate 102 to define active areas, form isolation regions, or perform other processing as is known in the art. The first and second dielectric layers 104, 106 each comprise one or more oxide-based layers as described more fully herein. The semiconductor device 100 defines a first region 108 and a second region 110. The first region 108 may form for example, a portion of a DRAM memory array, and includes a first contact structure 112 filled with a conductive material, a second contact structure 114 filled with a conductive material, a first transistor structure 116, and a second transistor structure 118. A capacitor container 120 is formed in the second dielectric layer 106 generally above the second contact structure 114. The capacitor container 120 may be formed for example, by etching through the second dielectric layer 106 to the second contact structure 114. While the capacitor container 120 is illustrated as overlying a single contact structure, the capacitor container 120 may overly multiple contact structures as the specific application dictates. The second region 110 includes a contact via 122 formed through both the first and second dielectric layers 104, 106. Depending upon the application, there may be intervening or additional layers of material formed on the semiconductor device.

Figure 6:
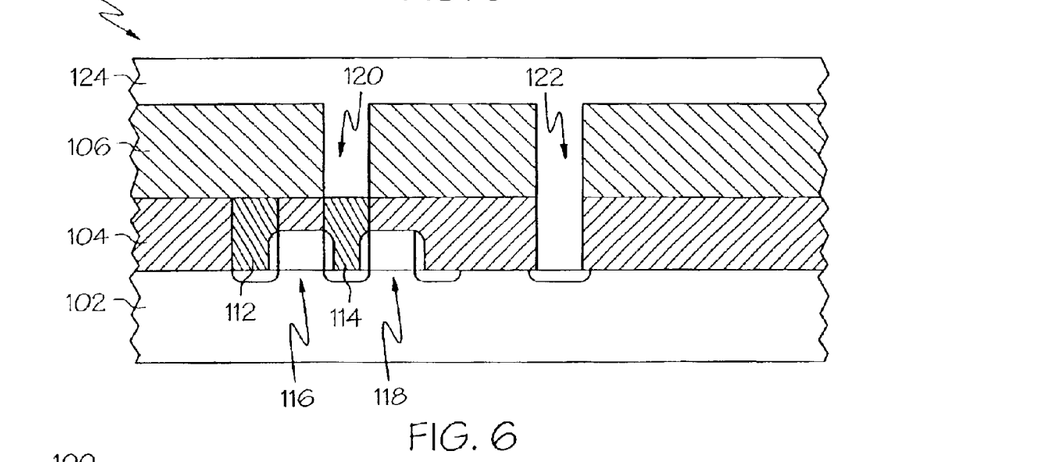
FIG. 6 is a cross-sectional illustration of the portion of the substrate illustrated in FIG. 5, wherein a titanium-based layer is formed over the oxide-based layers according to one embodiment of the present invention.

Referring to FIG. 6, a titanium-based layer 124 is deposited over the second dielectric layer 106 so as to at least partially fill the capacitor container 120 and at least partially fill the contact via 122. While illustrated in FIG. 6 as a continuous layer, the titanium-based layer 124 may also be applied in a selective manner such that the capacitor container 120 is at least partially filled with the titanium-based layer 124, and, the contact via 122 is at least partially filled with the titanium-based layer 124, and portions of the surface of the second dielectric 106 is substantially free from the titanium-based layer 124.

Figure 7:
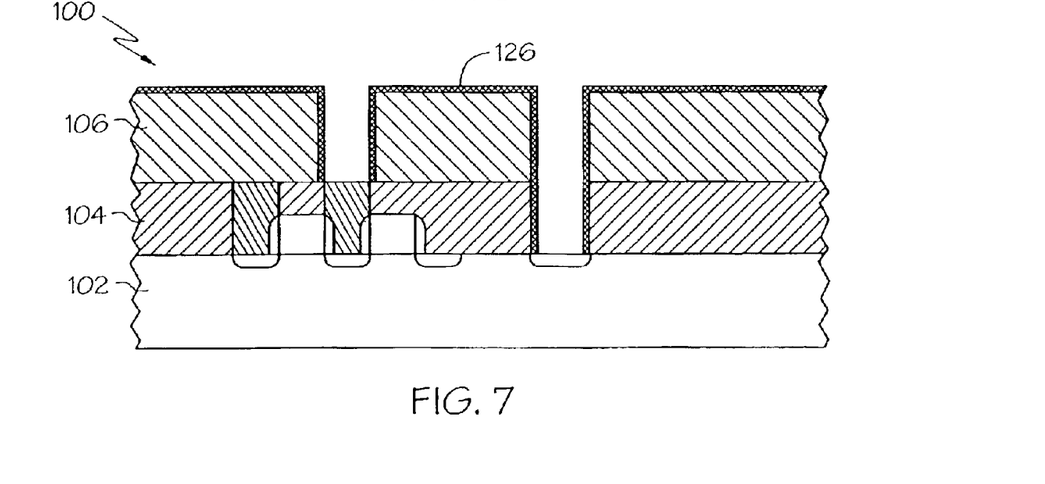
FIG. 7 is a cross-sectional illustration of the portion of the substrate illustrated in FIG. 6, wherein the titanium-based layer is etched from the surface of the oxide-based layer activating the surface (illustrated in the Figure by a cross-hatched area) for electroless deposition according to one embodiment of the present invention.

The titanium-based layer 124 is removed from the semiconductor device 100, such as by performing a Piranha etch or APM etch, and the surface of the first and second dielectric layers 104, 106 becomes activated for electroless plating defining a catalytic surface 126 as shown in FIG. 7. In FIG. 7, cross-hatching illustrated about the catalytic surface 126 of the first and second dielectric layers 104, 106 is meant to indicate that the surfaces are now activated to receive electroless plating, and no new layers are formed. Also, an optional activation may be performed, for example, using an HF/Pd-based chemistry.

Figure 8:
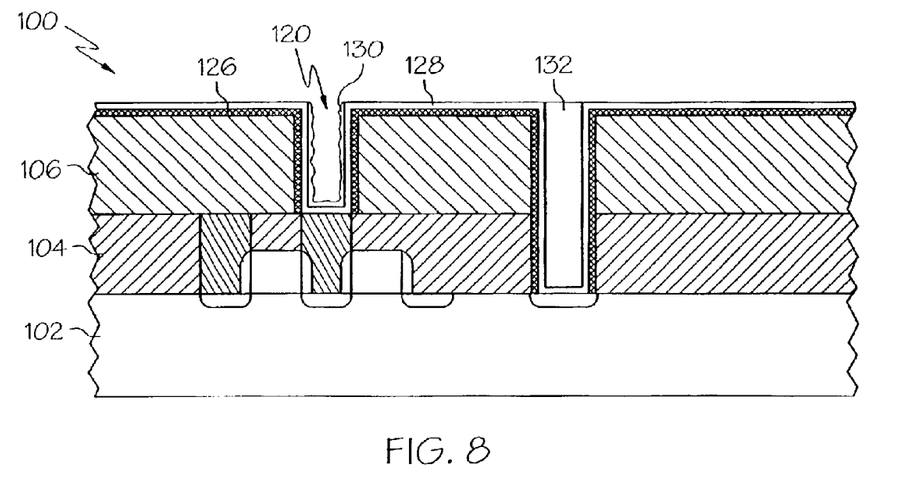
FIG. 8 is a cross-sectional illustration of the portion of the substrate shown in FIG. 7, wherein a conductive material is formed over the surface of the oxide-based layer using electroless plating techniques according to one embodiment of the present invention to define the lower electrode of the capacitor structure, and to fill a via defining the contact to the substrate.

Referring to FIG. 8, an electroless plating deposition technique is utilized to deposit a first conductive layer 128 in the form of a thin film over the catalytic surface 126 of the first and second dielectric layers 104, 106. The first conductive layer 128 will only adhere to the activated surfaces of the first or second dielectric layers 104, 106, and thus the first conductive layer 128 may optionally be selectively applied. The first conductive layer 128 may comprise for example, a nickel phosphorous, platinum, platinum-rhodium, tungsten, palladium, ruthenium, or other electroless plating deposited directly on the catalytic surface 126 of the first and second dielectric layers 104, 106 with or without activation treatments, however other electroless chemistries may also be used as explained more fully herein.

After performing electroless plating, conductive materials may be deposited over the first conductive layer 128. For example, as shown, a second conductive layer 130 defining a bottom electrode is formed within the capacitor container 120. As shown in the Figures, the second conductive layer 130 comprises a rugged or roughed conductive material such as a hemispherically grained (HSG) polysilicon material, but other suitable conductive materials may also be used. A third conductive layer 132 is deposited so as to fill in the via and make electrical contact to the semiconductor substrate 102. The third conductive layer may comprise any conductive material used to form an electrical connection including for example, doped or undoped polysilicon, or metals or metal alloys including aluminum, copper, gold, silver, tungsten, or alloys thereof. Further, any number of conductive layers may be deposited as the specific application dictates.

Figure 9:
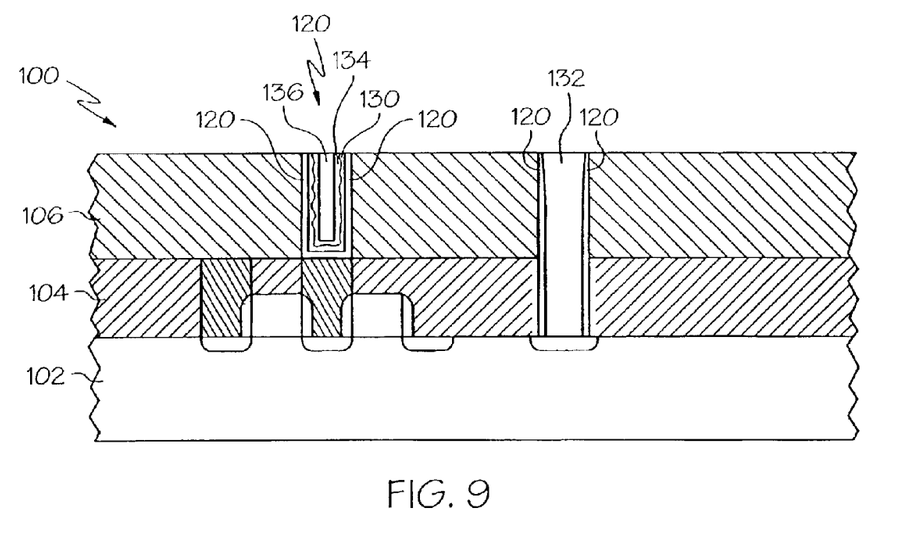
FIG. 9 is a cross-sectional illustration of the portion of the substrate shown in FIG. 8, wherein the layer of conductive material and portions of the electroless plating have been removed from the substrate, and the remainder of the capacitor structure has been formed; and, FIG. 10 is a flow chart outlining the processing steps to electrolessly plate an oxide-based material according to one embodiment of the present invention.

Referring to FIG. 9, the semiconductor device 100 is illustrated in a further processing stage. As shown, the thin film first conductive layer 120 has been removed back to the surface of the second dielectric layer 106. A third dielectric layer 134 has been deposited over the second conductive layer 130 formed in the capacitor container 120, and a fourth conductive layer 136 has been deposited over the third dielectric layer within the capacitor container 120 defining the top electrode of the capacitor structure. The third dielectric layer 134 can be any material suitable for the fabrication of capacitor structures. Likewise, the fourth conductive layer 136 defining the top electrode of the capacitor structure may comprise any suitable conductive material.

Figure 10:
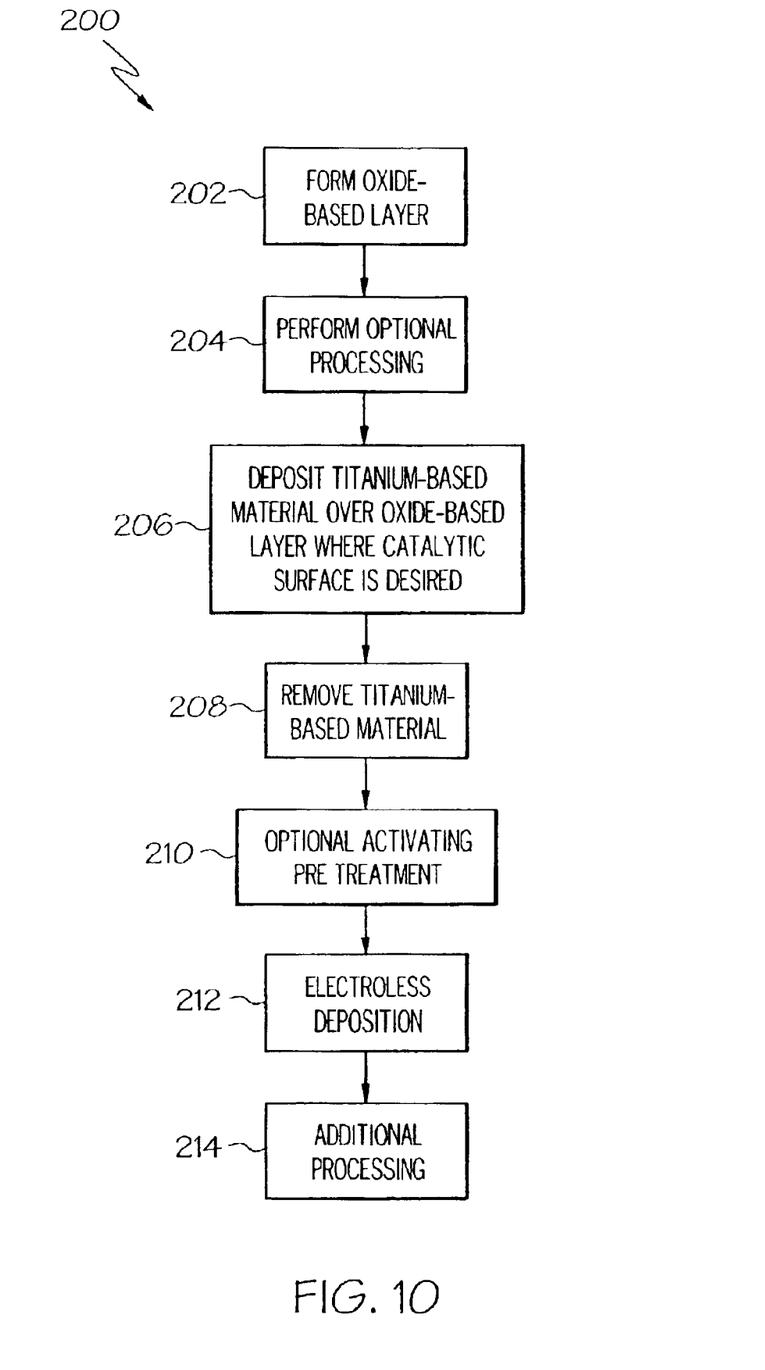

Referring to FIG. 10, a process 200 of performing electroless plating of an oxide-based layer of material is summarized. Initially, at least one oxide-based layer is formed 202 during the fabrication of a semiconductor device. Optional processing 204 is performed to the oxide-based layer. For example, one or more openings such as trenches, containers, or vias are formed in the oxide-based layer. A layer of a titanium-based material is deposited over the oxide-based layer where it is desirable to activate the surface of the oxide-based layer for electroless plating 206. This may optionally be performed as a selective process such as by masking the semiconductor device, or by using one or more sacrificial layers. For example, a layer of titanium based material may be deposited over the oxide-based layer using CVD at a temperature in excess of 550 degrees Celsius.

The layer of titanium-based material is subsequently removed 208, for example, using a Piranha or APM etch, thus activating the surface of the oxide-based layer for electroless plating. An optional activation pretreatment is performed 210, then a conductive material is electrolessly deposited 212 on the surface of the oxide-based layer in those areas activated by the previously removed layer of titanium-based material. Finally, additional processing 214 is performed to complete the semiconductor device.

The various embodiments of the present invention may be used for any application where it is desirable to use electroless plating techniques to deposit a metal or metal alloy film over an oxide-based layer. For example, electroless plating may be used to fill contact holes, vias, and trenches, even those with relatively high aspect ratios. Further, electroless plating may be used to form electrically conductive plugs and perform damascene processing. Also, electroless plating may be used to form layers of electrically conductive material over oxide-based layers where it is desirable to conformally plate deep structures. For example, electroless plating may be used to form plates for capacitor structures or plate barrier layers such as CoWP.

Also, the various embodiments of the present invention allow for selective electroless plating on an oxide-based surface. The oxide-based surface becomes catalytically active in those areas in which a titanium-based material has been deposited and subsequently removed. Accordingly, the areas of the oxide-based layer that receive the electroless plating can be controlled by controlling the manner in which the titanium-based material is deposited and subsequently etched. This may result in a reduction of the number of lithographic patterning and etching steps required to complete the fabrication of a particular device.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of electroless plating an oxide-based surface comprising:
    forming a layer of titanium-based material using chemical vapor deposition on an oxide-based surface;
    removing said layer of titanium-based material from said oxide-based surface; and,
    performing electroless plating over said oxide-based surface.

2. The method according to claim 1, wherein the electroless plating is performed without first applying an activation pretreatment.

3. The method according to claim 1, further comprising applying an activation pretreatment prior to electroless plating.

4. The method according to claim 3, wherein said activation pretreatment comprises a palladium/hydrofluoric acid based chemistry.

5. The method according to claim 1, wherein said chemical vapor deposition of said layer of titanium-based material is performed at a temperature of at least 550 degrees Celsius.

6. The method according to claim 1, wherein said layer of titanium-based material is removed by performing an etch of said layer of titanium-based material.

7. The method according to claim 6, wherein said etch comprises a Piranha etch.

8. The method according to claim 6, wherein said etch comprises a sulfuric acid etch with hydrogen peroxide.

9. The method according to claim 6, wherein said etch comprises sulfuric a sulfuric acid etch with ammonium persulfate.

10. The method according to claim 6, wherein said etch comprises a wet chemical etch in an ammonium-hydroxide peroxide mixture.

11. The method according to claim 6, wherein said etch comprises an APM etch.

12. The method according to claim 11, wherein said APM etch is performed at an elevated temperature.

13. The method according to claim 12, wherein said elevated temperature comprises a temperature of at least 35 degrees Celsius.

14. The method according to claim 13, wherein said elevated temperature comprises a temperature in the range of 35 to 60 degrees Celsius.

15. A method performing electroless plating comprising:
    forming an oxide-based layer;
    performing a chemical vapor deposition process to deposit a layer of titanium-based material over said oxide-based layer;
    etching said layer of titanium-based material from said oxide-based layer; and,
    performing electroless plating over said oxide-based surface.

16. The method according to claim 5, wherein the electroless plating is performed without first applying an activation pretreatment.

17. The method according to claim 15, further comprising applying an activation pretreatment prior to electroless plating.

18. The method according to claim 17, wherein said activation pretreatment comprises a palladium/hydrofluoric acid based chemistry.

19. A method of performing electroless plating comprising:
    performing a chemical vapor deposition process at a temperature of at least 550 degrees Celsius to deposit a layer of titanium-based material over an oxide-based layer;
    performing a Piranha wet etch to remove said titanium-based layer from said oxide-based layer; and,
    performing electroless plating over said oxide-based surface.

20. The method according to claim 19, wherein the electroless plating is performed without first applying an activation pretreatment.

21. The method according to claim 19, further comprising applying an activation pretreatment prior to electroless plating.

22. The method according to claim 21, wherein said activation pretreatment comprises a palladium/hydrofluoric acid based chemistry.

23. A method of performing electroless plating comprising:
    performing a chemical vapor deposition process to deposit a layer of titanium-based material over an oxide-based layer;
    performing an etching operation to remove said layer of titanium-based material from said oxide-based layer; and,
    performing electroless plating of a metal directly over said oxide-based surface.

24. The method according to claim 23, wherein the electroless plating is performed without first applying an activation pretreatment.

25. The method according to claim 23, further comprising applying an activation pretreatment prior to electroless plating.

26. The method according to claim 25, wherein said activation pretreatment comprises a palladium/hydrofluoric acid based chemistry.

27. The method of performing electroless plating according to claim 23, wherein said metal is electroless plated over said oxide-based layer without a nucleating layer therebetween.

28. A method of performing electroless plating comprising:
    performing a chemical vapor deposition process to deposit a layer of titanium-based material over an oxide-based layer;
    performing a wet etch to remove said titanium-based layer from said oxide-based layer; and,
    performing electroless plating over said oxide-based surface.

29. The method according to claim 28, wherein said chemical vapor deposition process is performed at a temperature of at least 550 degrees Celsius.

30. The method according to claim 28, wherein said wet etch comprises a Piranha etch.

31. The method according to claim 28, wherein said wet etch comprises an APM etch.

32. The method according to claim 28, wherein said electroless plating is performed directly on the surface of said oxide-based layer.

33. The method according to claim 28, wherein said electroless plating comprises a nickel-phosphor electroless plating.

34. The method according to claim 28, wherein an activation pretreatment is performed prior to said electroless deposition.

35. The method according to claim 34, wherein said pretreatment comprises a palladium activation pretreatment.

36. The method according to claim 35, wherein said pretreatment further comprises a solution selected from the group consisting of HF, $H_2SO_4$, and HCL.

37. The method according to claim 34, wherein said pretreatment comprises a tin-zinc activation pretreatment.

38. The method according to claim 34, wherein said oxide-based layer comprise BPSG and said pretreatment comprises an HF/Pd chemistry.

39. The method according to claim 34, wherein said pretreatment comprises a palladium chloride in hydrofluoric acid chemistry.

40. The method according to claim 34, wherein said pretreatment comprises an $HF/PdCl_2$ chemistry.

* * * * *

UNITED STATES PATENT AND TRADEMARK OFFICE
CERTIFICATE OF CORRECTION

PATENT NO. : 6,872,659 B2
DATED : March 29, 2005
INVENTOR(S) : Nishant Sinha

It is certified that error appears in the above-identified patent and that said Letters Patent is hereby corrected as shown below:

Column 4,
Line 62, ""surface using electroless" should read -- surface 18 using electroless --

Column 5,
Line 41, "0.01-0.5 grains of PDCl2" should read -- 0.01-0.5 grams of $PdCl_2$ --

Column 9,
Line 19, "to claim 5," should read -- to claim 15, --

Signed and Sealed this

Twenty-sixth Day of July, 2005

JON W. DUDAS
*Director of the United States Patent and Trademark Office*